US 10,473,399 B2

United States Patent
Colgan et al.

(10) Patent No.: US 10,473,399 B2
(45) Date of Patent: Nov. 12, 2019

(54) CONNECTION STRUCTURE, MAGNETIC ANNEALING DEVICE USING SAME, AND CONNECTING METHOD

(71) Applicant: Tokyo Electron Limited, Tokyo (JP)

(72) Inventors: Ian Colgan, Dublin (IE); George Eyres, Dublin (IE); Ioan Domsa, Dublin (IE); Junichi Sato, Iwate (JP); Koyu Hasegawa, Iwate (JP); Tomoaki Abe, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 127 days.

(21) Appl. No.: 15/001,391

(22) Filed: Jan. 20, 2016

(65) Prior Publication Data

US 2016/0216032 A1    Jul. 28, 2016

(30) Foreign Application Priority Data

Jan. 23, 2015 (JP) .................. 2015-011743

(51) Int. Cl.
*F27D 3/00*    (2006.01)
*B23P 19/00*    (2006.01)
(Continued)

(52) U.S. Cl.
CPC .......... *F27D 3/0084* (2013.01); *C21D 9/0006* (2013.01); *F27B 3/02* (2013.01);
(Continued)

(58) Field of Classification Search
CPC ............ C21D 9/0006; H01L 21/67126; H01L 21/67754; H01L 21/67376; H01L 21/67109; F27B 3/02; F27B 3/0084
See application file for complete search history.

(56) References Cited

U.S. PATENT DOCUMENTS 3,299,574 A * 1/1967 Alexeff ................ C21D 9/0006
49/401
4,751,895 A * 6/1988 Yates ................ H01L 21/67126
118/500

(Continued)

FOREIGN PATENT DOCUMENTS

JP         08-088188 A    4/1996
JP         2001-015432 A  1/2001
(Continued)

OTHER PUBLICATIONS

Apple Rubber, Seal Design Guide, https://web.archive.org/web/20140708234557/http://www.applerubber.com/src/pdf/seal-design-guide.pdf, Jul. 2014.*

*Primary Examiner* — Steven S Anderson, II
(74) *Attorney, Agent, or Firm* — Abelman, Frayne & Schwab (57) ABSTRACT

Disclosed is a connection structure that connects a housing to a magnetic annealing furnace that is provided with a fixedly arranged magnet and includes a first drum flange having a cylindrical flange portion. The connection structure includes: a second drum flange that is attached and fixed to the housing and includes a flange portion configured to externally or internally fit the flange portion of the first drum flange thereto; a first sealant that is installed between facing surfaces of the housing and the second drum flange; and a second sealant that is installed between facing surfaces of the first and second drum flanges.

19 Claims, 9 Drawing Sheets

(51) Int. Cl.
*H01L 21/67* (2006.01)
*H01L 21/677* (2006.01)
*F27B 3/02* (2006.01)
*C21D 9/00* (2006.01)

(52) U.S. Cl.
CPC .. *H01L 21/67109* (2013.01); *H01L 21/67126* (2013.01); *H01L 21/67754* (2013.01)

(56) References Cited

U.S. PATENT DOCUMENTS

| | | | | |
|---|---|---|---|---|
| 5,395,485 | A * | 3/1995 | Nashan | C10B 25/06 202/248 |
| 2002/0023458 | A1* | 2/2002 | Sakata | F27B 5/04 62/378 |
| 2003/0002961 | A1* | 1/2003 | Davis | H01L 21/67126 414/217.1 |
| 2005/0183824 | A1* | 8/2005 | Lee | H01L 21/67126 156/345.31 |
| 2014/0284321 | A1* | 9/2014 | Ono | H01L 21/67754 219/601 |

FOREIGN PATENT DOCUMENTS

| | | | |
|---|---|---|---|
| JP | 2006-210370 A | | 8/2006 |
| JP | 2006210370 A | * | 8/2006 |
| JP | 2014-183281 A | | 9/2014 |
| WO | 2014/088414 A | | 6/2014 |

* cited by examiner

CONNECTION STRUCTURE, MAGNETIC ANNEALING DEVICE USING SAME, AND CONNECTING METHOD

CROSS-REFERENCE TO RELATED APPLICATIONS

This application is based on and claims priority from Japanese Patent Application No. 2015-011743, filed on Jan. 23, 2015, with the Japan Patent Office, the disclosure of which is incorporated herein in its entirety by reference.

TECHNICAL FIELD

The present disclosure relates to a connection structure, a magnetic annealing device using the same, and a connecting method.

BACKGROUND

Conventionally, a technology has been known which, in a processing system including a plurality of chambers, hermetically connects a process chamber and a supporting member to each other by elastic bellows and enables deformation of a chamber to be absorbed by the elasticity of the bellows (see, e.g., Japanese Patent Laid-Open Publication No. 2001-015432). In Japanese Patent Laid-Open Publication No. 2001-015432, a sluice valve and bellows are installed not only between a transfer module chamber and a load chamber, but also between a transfer module chamber and an unload chamber, such that even when a pressure within a chamber switches between the atmospheric pressure and a depressurized state thereby causing deformation in the chamber, the deformation is absorbed by the bellows, and thus, the change of the pressure does not adversely affect the process. In the connection using the bellows, even when a positional deviation occurs between objects to be connected ("connection objects"), a deformation caused by the positional deviation can be absorbed by the elasticity of the bellows. Thus, even in a case of a chamber to member connection or a chamber-to chamber connection, the connection objects may be properly connected to each other.

SUMMARY

A connection structure according to an aspect of the present disclosure relates to a connection structure that connects a housing to a magnetic annealing furnace that is provided with a fixedly arranged magnet and includes a first drum flange having a cylindrical flange portion. The connection structure includes: a second drum flange that is attached and fixed to the housing and includes a flange portion configured to externally or internally fit the flange portion of the first drum flange thereto; a first sealant that is installed between facing surfaces of the housing and the second drum flange; and a second sealant that is installed between facing surfaces of the first drum flange and the second drum flange.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 2A and 2B are views illustrating a configuration of an exemplary boat loader of the magnetic annealing furnace according to the first exemplary embodiment of the present disclosure.

FIGS. 4A and 4B are views for describing a connection structure between a housing and the magnetic annealing furnace.

FIGS. 6A to 6C are views for describing an exemplary connection structure and an exemplary magnetic annealing apparatus according to a second exemplary embodiment of the present disclosure.

FIGS. 7A and 7B are views illustrating an exemplary additional housing positioning and fixing structure of a connection structure and a magnetic annealing apparatus according to an exemplary embodiment of the present disclosure. FIG. 7B is a view illustrating the exemplary additional housing positioning and fixing structure.

FIGS. 8A and 8B are views illustrating a detailed configuration of an exemplary additional housing positioning structure.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

The connection using the bellows as described in Japanese Patent Laid-Open Publication No. 2001-015432 may not sufficiently absorb the positional deviation between the connection objects in a diametrical direction or the deformation of the connection objects when a length of the bellows is not sufficiently secured, so that the connection may not sufficiently serve as a cushion to absorb an error.

A magnetic annealing apparatus has been known in which a superconducting magnet is installed around a thermal processing furnace and a heat processing for a wafer is performed in a magnetic field (see, e.g., Japanese Patent Laid-Open Publication No. 2014-183281). In general, in such a magnetic annealing apparatus, the weight of the superconducting magnet is in a level of tens to hundreds of tons and hence very heavy, and the thermal processing furnace and the superconducting magnet are integrally configured as a magnetic annealing furnace. Thus, once the magnetic annealing furnace is installed, it is difficult to move the magnetic annealing furnace. The magnetic annealing furnace accommodates therein a wafer boat, which is a wafer holder, in the state where a plurality of wafers are loaded in the wafer boat, and carries out magnetic annealing by heating the wafers of the wafer boat in the state where the inside of the furnace becomes in the vacuum state and a magnetic field is generated therein.

Accordingly, it is required to connect a housing, which accommodates a boat loader capable of carrying the wafer boat into the magnetic annealing furnace, to a carry-in port of the magnetic annealing furnace. As described above, since the magnetic annealing treatment is a clean process in which the inside of the furnace is in the vacuum state, it is required to connect the housing to be communicated with the inside of the furnace to the carry-in port in the state where airtightness is maintained. In this case, connecting the housing and the magnetic annealing furnace to each other by using bellows may be considered. However, when the spacing between the housing and the magnetic annealing furnace is very short and, for example, a positional deviation occurs, the bellows may not sufficiently absorb an error caused by the positional deviation. Further, since it is difficult to move the magnetic annealing furnace after installation thereof as described above, it is required to perform correct positional alignment of the housing side to the magnetic annealing furnace during the connection. Thus, it is very difficult to connect the housing to the magnetic annealing furnace while maintaining the airtightness.

Accordingly, the present disclosure is to provide a connection structure in which a housing may be easily and securely connected to a magnetic annealing furnace, and a magnetic annealing apparatus and a connecting method using the connection structure.

In order to achieve the above-described objective, an aspect of the present disclosure provides a connection structure that connects a housing to a magnetic annealing furnace that is provided with a fixedly arranged magnet and includes a first drum flange having a cylindrical flange portion. The connection structure includes: a second drum flange that is attached and fixed to the housing and includes a flange portion configured to externally or internally fit the flange portion of the first drum flange thereto; a first sealant that is installed between facing surfaces of the housing and the second drum flange; and a second sealant that is installed between facing surfaces of the first drum flange and the second drum flange.

In the above-described connection structure, first and second grooves are formed on the facing surfaces of the housing and the second drum flange and the facing surfaces of the first and second drum flanges, the first and second sealants are installed in the first and second grooves, respectively.

In the above-described connection structure, the first and second sealants are O-rings.

In the above-described connection structure, the O-ring used as the second sealant has a crush rate that is set to be 7% to 20%.

In the above-described connection structure, each of the first and second drum flanges includes an attachment portion having a surface that forms a right angle with the surface of the flange portion from one end of the flange portion, the attachment portion being configured to be attached to a planar surface.

In the above-described connection structure, the magnetic annealing furnace includes a substrate carry-in port, and the attachment portion of the first drum flange is fixed to a planar surface around the substrate carry-in port of the magnetic annealing furnace by a fixing member.

In the above-described connection structure, the attachment portion of the second drum flange is fixed to a planar surface of an outer wall of the housing via the first sealant by a fixing member.

In the above-described connection structure, the fixing member is a bolt.

In the above-described connection structure, the flange portion of the second drum flange is inserted into and fixed to the inside of the flange portion of the first drum flange via the second sealant.

In the above-described connection structure, at least one of the facing surfaces of the magnetic annealing furnace and the housing is provided with a guide pin for positioning.

A magnetic annealing apparatus according to another aspect of the present disclosure includes the above-described magnetic annealing furnace, the above-described housing, and the above-described connection structure.

In the above-described magnetic annealing apparatus, the housing is a load chamber configured to carry a substrate into the magnetic annealing furnace.

The above-described magnetic annealing apparatus further includes a fixing member configured to fix the housing to a floor after the magnetic annealing furnace and the housing are connected to each other through the connection structure.

Another aspect of the present disclosure provides a method of connecting a housing to a magnetic annealing furnace that is provided with a fixedly arranged magnet and includes a first drum flange having a cylindrical flange portion. The connecting method includes: semi-fixing a second drum flange, which includes a cylindrical flange portion configured to externally or internally fit the flange portion of the first drum flange thereto, and an attachment portion having a planar surface expanding vertically to a surface of the flange portion from one end of the flange portion, to an outer wall of the housing via the first sealant by using a fixing member; installing a second sealant on the flange portion of the second drum flange; fitting the second drum flange to the first drum flange via the second sealant to connect the second rum flange to the first drum flange; and fixing the second drum flange to the outer wall of the housing by using the fixing member.

The above-described connecting method further includes fixing the housing onto a floor, after the fixing of the second drum flange to the outer wall of the housing.

In the above-described connecting method, a guide pin for positioning is installed on at least one of facing surfaces of the magnetic annealing furnace and the housing, and the fitting of the second drum flange to the first drum flange via the second sealant to connect the second drum flange to the first drum flange is performed while the positioning of the second drum flange is performed by using the corresponding guide pin.

In the above-described connecting method, the fixing member is a bolt, the semi-fixing of the second drum flange to the outer wall of the housing via the first sealant by the fixing member is performed by fastening the bolt halfway, and the fixing of the second drum flange onto the outer wall of the housing is performed by tightening the bolt to the end of the bolt thread.

According to the present disclosure, the housing may be easily connected to the magnetic annealing furnace while maintaining a high seal performance.

Hereinafter, exemplary embodiments of the present disclosure are described with reference to the drawings.

First, a configuration of a magnetic annealing furnace and a wafer boat, to which the connection structure according to the first exemplary embodiment of the present disclosure can be properly applied, is described.

Figure 1:
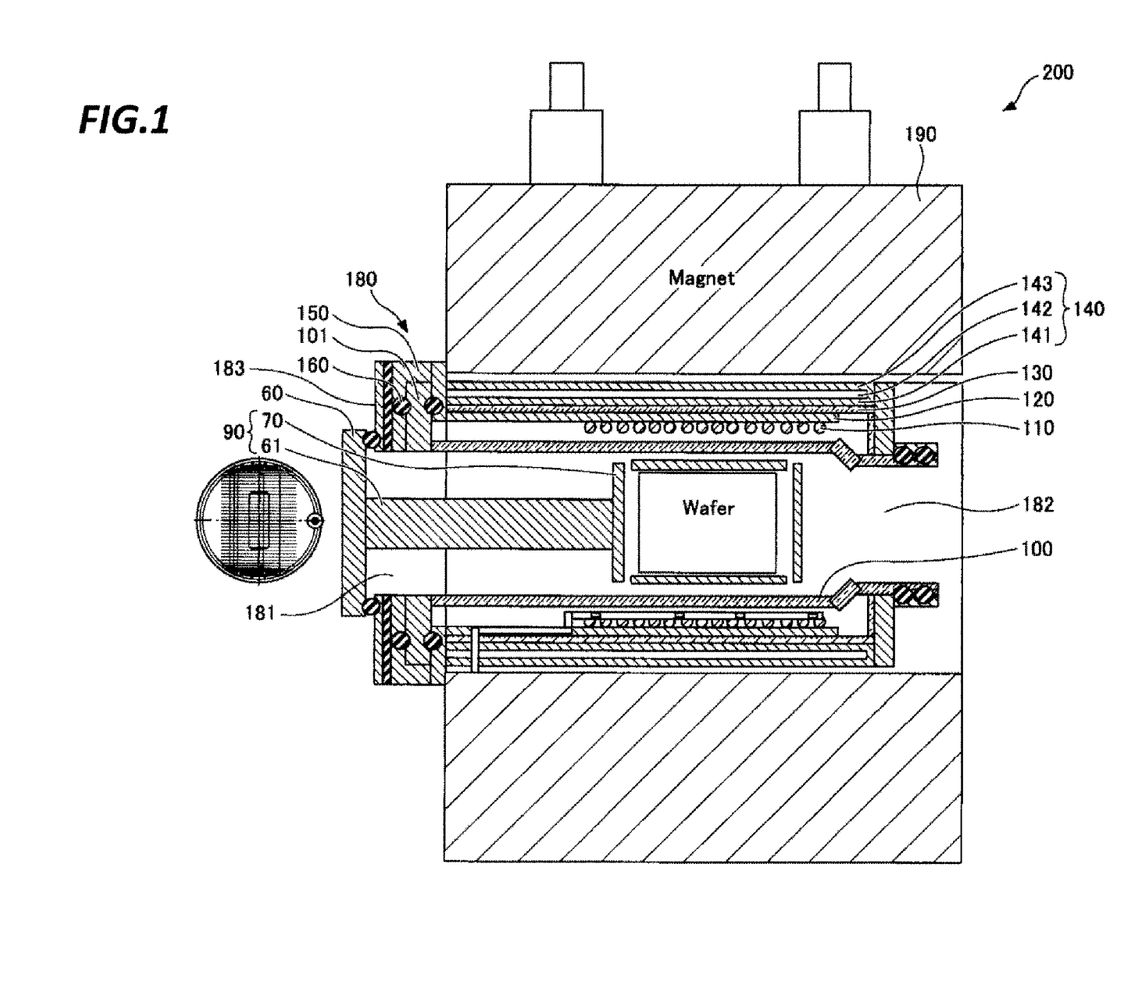
FIG. 1 is a cross-sectional view illustrating an overall configuration of a magnetic annealing furnace, to which a connection structure according to a first exemplary embodiment of the present disclosure may be properly applied.

FIG. 1 is a cross-sectional view illustrating an overall configuration of a magnetic annealing furnace 200. The magnetic annealing furnace 200 includes an annealing furnace 180 and a magnet 190. For example, as illustrated in FIG. 1, the magnet 190 is installed to cover an outer periphery of a longitudinally extending surface of the annealing furnace 180. As the magnet 190, various magnets may be used as long as the magnets are capable of generating a uniform magnetic field in a predetermined direction (e.g., in a forward and backward direction) in an area of the annealing furnace 180 where wafers W are held. However, as described above, for example, a solenoid-type magnet (a superconducting magnet) may be used.

The annealing furnace 180 includes a processing vessel 00, a heater 110, a heater supporting metal plate 120, a heat insulating member 130, a water cooling jacket 140, a flange holding unit 150, and an O-ring 160. The annealing furnace 180 also includes a substrate carry-in port 181 and an evacuation port 182, and is configured to accommodate a cap 60, a wafer boat supporting unit 61, and a wafer boat 70 from the substrate carry-in port 181 into the processing vessel 100. The evacuation port 182 is provided to enable evacuation of the inside of the processing vessel 100. A gas flange surface 183 having a planar surface is formed around the substrate carry-in port 181. The wafer boat 70 is configured to hold wafers W.

The processing vessel 100 refers to a vessel that accommodates the wafer boat 70 therein to carry out a magnetic annealing treatment. The processing vessel 100 has a horizontal tubular shape. There is no problem if the processing vessel 100 can accommodate the wafer boat 70 with the horizontal tubular shape. The processing vessel 100 may be configured in, for example, a cylindrical shape. The processing vessel 100 may be configured as, for example, a quartz tube that is formed of quartz.

The heater 110 refers to a means that heats the wafers W. The heater 110 is installed outside the processing vessel 100 and has a longer length than the wafer boat 70 to cover the wafer boat 70 in the longitudinal direction of the processing vessel 100. The heater 110 is installed along the longitudinal direction of the processing vessel 100, to cover the longitudinally extending surface of the processing vessel 100. In addition, the heater 110 is not installed at the locations covering the opposite end side surfaces of the cylindrical processing vessel 100, i.e., at the substrate carry-in port 181 and the evacuation port 182, in view of securing a carry-in/carry-out path and an evacuation path.

The heater supporting metal plate 120 is a metal plate that supports the heater 110, and the heater 110 is attached to the heater supporting metal plate 120. The heat insulating member 130 refers to a member that traps heat radiated by the heater 110 in the inside thereof, to suppress release of the heat to the exterior side where the magnet 190 is positioned. The heat insulating member 130 is installed to cover the outer peripheral surface of the heater supporting metal plate 120. The water cooling jacket 140 is provided in order to suppress the temperature of the annealing furnace 180 from overly increasing. The water cooling jacket 140 is installed to cover the outer peripheral surface of the heat insulating member 130. The water cooling jacket 140 includes an internal double pipe 141 and an external double pipe 143, and a coolant 142 flows through a gap between the internal double pipe 141 and the external double pipe 143. The coolant 142 may be, for example, cool water. Any other type of a coolant may also be available. With this configuration, it is possible to suppress a large amount of heat from being radiated to the magnet 190 side.

A flange portion 101 and a flange holding portion 150 are structures provided to properly fix the processing vessel 100, and the flange holding portion 150 holds the flange portion 101 via the O-ring 160 so as to hold the processing vessel 100. The O-ring 160 is installed at other locations to seal and fix the locations as needed.

In addition, the inside of the processing vessel 100 on a front end side of the wafer boat 70 (an opposite side to the cap 60) is opened to form the evacuation port 182, and evacuation is carried out through the evacuation port 182. Since the magnetic annealing treatment is carried out under a high vacuum, the inside of the processing vessel 100 is evacuated by a turbo-molecular pump or the like, and maintained with a high vacuum of, for example, about $5 \times 10^{-7}$ Torr.

Figure 2A:
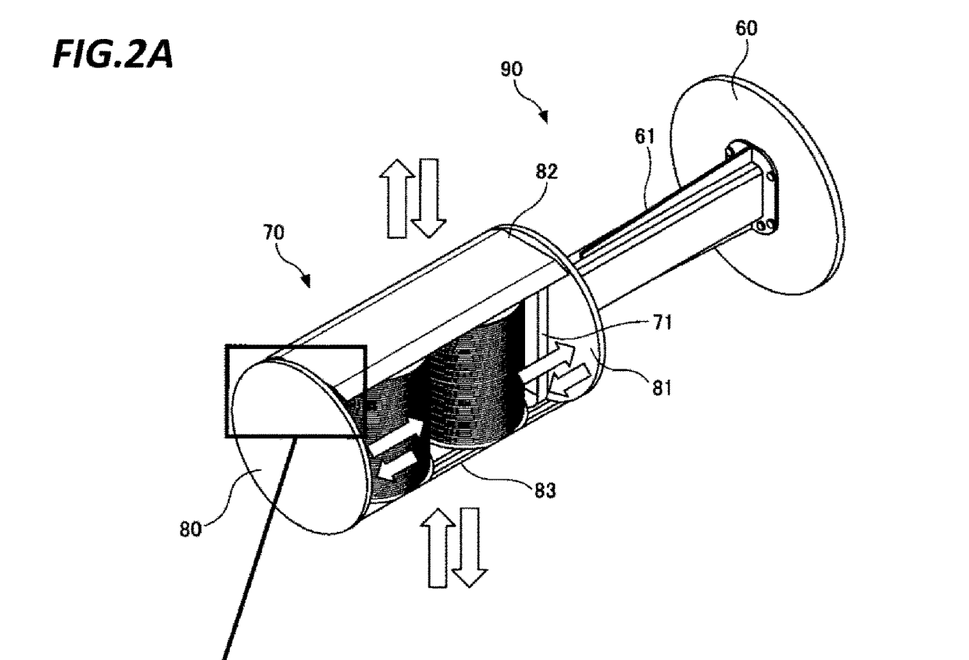
FIG. 2A is a perspective view illustrating an overall configuration of the boat loader.
Figure 2B:
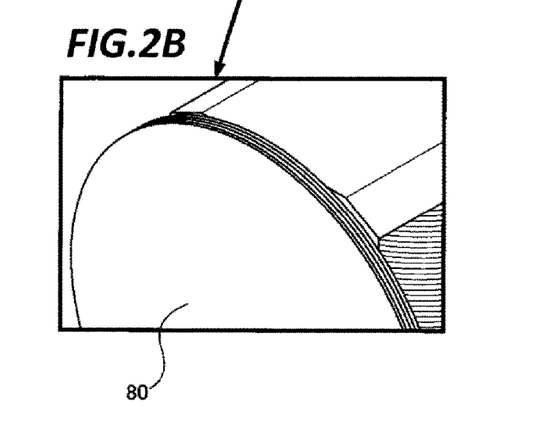
FIG. 2B is an enlarged view of an area indicated by a thick solid line rectangle in FIG. 2A in which a configuration of a heat blocking plate is illustrated.

FIGS. 2A and 2B are views illustrating an exemplary boat loader 90 of the magnetic annealing furnace 200 according to the first exemplary embodiment of the present disclosure. FIG. 2A is a perspective view illustrating an overall configuration of the boat loader 90, and FIG. 2B is an enlarged view illustrating a configuration of a heat blocking plate 80.

In FIG. 2A, the boat loader 90 includes the cap 60, the boat supporting unit 61, the wafer boat 70, and heat blocking plates 80 to 83. The heat blocking plates 80 to 83 are means to block heat radiation from the heater 100, suppress occurrence of non-uniformity of a temperature by radiation concentrated on a certain location, and achieve uniformity of heat to be radiated to the wafers W, when the magnetic annealing treatment is carried out in the magnetic annealing furnace 200. The heat blocking plates 80 to 83 are installed to cover the periphery of the wafer boat 70. Specifically, the heat blocking plates 80 and 81 are installed to cover the both end surfaces of the longitudinal direction of the wafer boat 70, respectively, and the heat blocking plates 82 and 83 are installed to cover the top and bottom surfaces of the wafer boat 70, respectively.

As described above with reference to FIG. 1, the heater 110 is installed to cover the longitudinally extending surface of the processing vessel 100 and is not installed on the both end side surfaces of the processing vessel 100. Thus, the heat blocking plates 80 and 81, which are installed on the both end side surfaces of the longitudinal direction of the wafer boat 70, fully perform the function to block heat radiation. Meanwhile, in FIG. 2A, the wafers W are positioned horizontally and loaded in a vertical direction. Thus, the wafer W positioned on the uppermost surface of the loaded structure and the wafer W positioned on the lowermost surface of the loaded structure directly receive the heat radiated from the heater 110, and a difference in temperature between the wafer W positioned on the uppermost or lowermost surface and a wafer W positioned in the middle of the stacked structure increases. Accordingly, when the wafers W are held in the horizontal state and loaded in the vertical direction, the heat blocking plates 82 and 83 are installed to cover the wafers W on the top and bottom surfaces of the wafer boat 70, and configured to reflect the heat from the heater 110. Accordingly, temperature equalization of the loaded wafers may be achieved W so that the wafers W may be uniformly heated.

In addition, when the wafers W are held in the wafer boat 70 in the state that the wafers W vertically stand and are arranged in the horizontal direction with a predetermined spacing, like books on a bookshelf, the heat from the heater 110 is incident in a direction oriented to the center from the entire outer peripheral side with respect to all the wafers W. Thus, the concentration of heat on certain locations (top and bottom surfaces) as in the case where the wafers W are held in the horizontal direction may hardly occur. Accordingly, in that case, the heat blocking plates 82 and 83 of the top and bottom surfaces of the wafer boat 70 need not to be installed, and it is sufficient to install the heat blocking plates 80 and 81 for heat keeping only at both the end side surfaces of the wafer boat 70.

As described above, when the locations for installing the heat blocking plates 80 to 83 are properly set according to a method of arranging the wafers W, heat equalization of the wafers W may be properly implemented.

The heat blocking plates 80 to 83 may be formed using any material as long as the material is nonmagnetic and is highly efficient in heat blocking effect. However, for example, a nonmagnetic metal material may be used. For example, stainless steel, titan, or the like may be properly used for the heat blocking plates 80 to 83.

As illustrated in FIG. 2B, the heat blocking plate 80 may be configured by stacking a plurality of sheets of thin plates. In addition, the heat blocking plate 82 may be formed with an engaging hole or the like to be engaged with a protrusion or the like of the wafer boat 70 as needed.

The magnetic annealing furnace 200 has, for example, the configuration as described above. In the magnetic annealing furnace 200, the weight of the magnet 190 is very heavy, and as illustrated in FIG. 1, the annealing furnace 180 and the magnet 190 are configured as a substantially integrated structure, of which the weight is in a level of hundreds of tons (e.g., about 300 tons). Thus, in general, it is difficult to move the magnetic annealing furnace 200 after installation.

In addition, the boat loader 90 is accommodated within a housing (not illustrated), which is connected to the gas flange surface 183 around the substrate carry-in port 181 of the magnetic annealing furnace 200 (the annealing furnace 180), and hermetically connected to the annealing furnace 180. The housing is configured such that the wafer boat 70 is capable of being loaded/unloaded using the boat loader 90 within the housing with the hermetically sealed structure. Hereinafter, the connection structure and the connecting method between the housing and the magnetic annealing furnace 200 (the annealing furnace 180) are described in detail.

Figure 3:
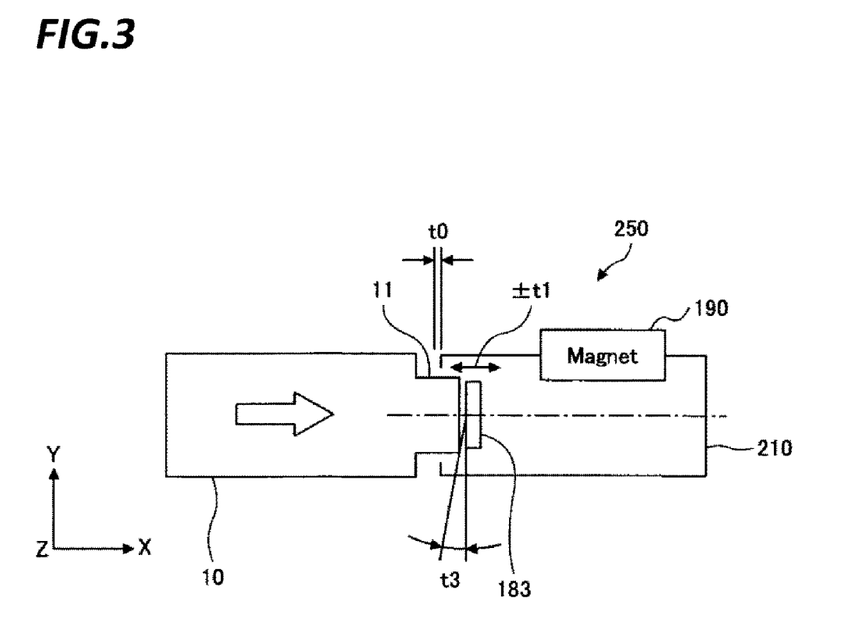
FIG. 3 is a view illustrating an exemplary magnetic annealing apparatus according to the first exemplary embodiment of the present disclosure.

FIG. 3 is a view illustrating an exemplary magnetic annealing apparatus 250 according to the first exemplary embodiment of the present disclosure. The magnetic annealing apparatus 250 includes a housing 10 and a magnetic annealing furnace 200 (not illustrated in FIG. 3) (see, e.g., FIG. 1 and FIGS. 2A and 2B). The housing 10 is a load chamber that accommodates the boat loader 90. The load chamber may also be referred to as a "boat loader module." The magnetic annealing furnace 200 side of the housing 10 has a connection portion 11 configured in a cylindrical shape, of which the width is slightly narrowed to be connected with the annealing furnace 200. In addition, the magnetic annealing furnace 200 is accommodated within a magnet shield 210. The magnet shield 210 is a cover to shield the magnet 190. As illustrated in FIG. 3, the connection portion 11 of the housing 10 is inserted into the magnet shield 210, and connected to the gas flange surface 183 of the magnet annealing furnace 200 (the annealing furnace 180) accommodated within the magnet shield 210.

In addition, FIG. 3 represents a tolerance t0 of an installation reference surface of the magnet shield 210, a tolerance tt of an axial direction of the gas flange surface 183, and an angle tolerance t3 of the gas flange surface 183, which will be described in detail later.

Figure 4A:
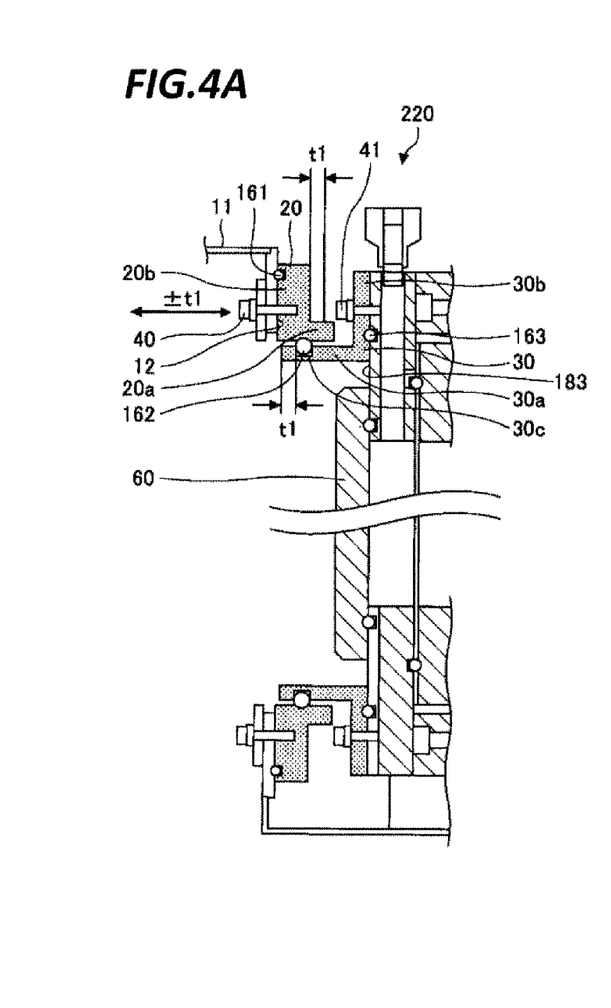
FIG. 4A is a cross-sectional view illustrating an exemplary connection structure between the housing and the magnetic annealing furnace.
Figure 4B:
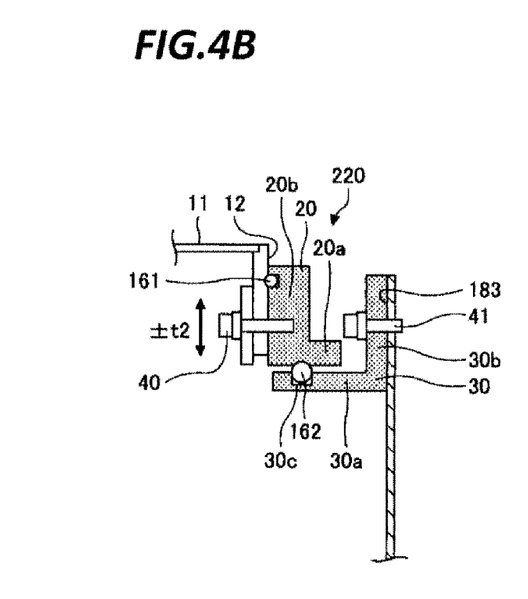
FIG. 4B is an enlarged cross-sectional view illustrating the exemplary connection structure according to the first exemplary embodiment of the present disclosure.

FIGS. 4A and 4B are views for describing the connection structure between the housing 10 and the magnetic annealing furnace 200. FIG. 4A is a cross-sectional view illustrating an exemplary connection structure 220 between the housing 10 and the magnetic annealing furnace 200.

FIG. 4A illustrates the connection structure 220 between the housing 10 and the magnetic annealing furnace 200, in which the connection portion 11 of the housing 10 has a drum flange 20 on a planar surface of a front end of the connection portion 11, which faces to the gas flange surface 183 of the magnetic annealing furnace 200 (the annealing furnace 180). In addition, the gas flange surface 183 of the magnetic annealing furnace 200 also has a drum flange 30. The drum flange 20 has a cylindrical flange portion 20a, and an attachment portion 20b configured to have a planar surface, which may be fixedly in contact with the front end surface 12 of the connection portion 11. Similarly, the drum flange 30 also has a cylindrical flange portion 30a, and an attachment portion 30b having a planar surface. The flange portions 20a and 30a have cylindrical flange surfaces, and one of the flange portions 20a and 30a is inserted into the other one of the flange portions 20a and 30a so as to overlap with each other. A sealant 162 is installed between the surfaces of the flange portions 20a and 30a which are opposite to each other, and the drum flanges 20 and 30 are hermetically connected to each other via the sealant 162.

Also, a sealant 161 is also installed between the planar surface of the leading end of the connection portion 11 of the housing 10 and the surface of the attachment portion 20b of the drum flange 20, sealant, and the front end surface 12 of the connection portion 11 and the attachment portion 20b of the drum flange 20 are fixedly in contact with each other by a bolt 40 via the sealant 161. Similarly, a sealant 163 is also installed between the attachment portion 30b of the drum flange 30 and the gas flange surface 183 of the magnetic annealing furnace 200, and the drum flange 30 is fixedly in contact with the gas flange surface 183 via the sealant 163. In addition, the drum flange 30 is fixed to the gas flange surface 183 by a bolt 41.

As described above, the connection structure 220 according to the first exemplary embodiment of the present disclosure uses drum flanges 20 and 30 so that the sealant 162 is used in a diametrical direction and the sealant 161 is also used in an axial direction. Accordingly, even if bellows is not used, the tolerance t1 in the axial direction is permissible. The tolerance t1 varies depending on, for example, a use, a configuration or a material of the connection structure 220, and may be, for example, ±10 mm.

FIG. 4B is an enlarged cross-sectional view of the exemplary connection structure 220 according to the present exemplary embodiment. As illustrated in FIG. 4B, the drum flange 20 is fixed to the leading end surface 12 of the connection portion 11 via the sealant 161 by the bolt 40. Due to the fixing by the bolt 40, the attachment portion 20b of the drum flange 20 is fixedly in contact with the leading end surface 12 of the connection portion 11 with a sufficient strength. Meanwhile, since the drum flange 20 is connected to the drum flange 30 via the sealant 162 with respect to the diametrical direction, the drum flange 20 is configured to be slidable in the axial direction while maintaining airtightness, and allow some degree of deformation in the axial direction. Accordingly, as described above, the connection structure 20 according to the present exemplary embodiment has a tolerance ±t1 in the axial direction. For the sealants 161 and 162, for example, O-rings formed of an elastic material such as, for example, rubber may be used. In addition, at the locations where the sealants 161 and 162 are installed, grooves may be formed to accommodate and position the bottom portions of the sealants 161 and 162. In addition, any other fixing member may be used instead of the bolt 40.

The attachment portion 30b of the drum flange 30 is also fixed to the gas flange surface 183 of the magnetic annealing furnace 200 by the bolt 41 with a sufficient strength. While a sealant is omitted, the sealant is practically installed between the gas flange surface 183 and the attachment portion 30b of the drum flange 30, as illustrated in FIG. 4A. In addition, the bolt 41 may be any other fixing device.

As described above, the flange portion 20a of the drum flange 20 is externally fitted to the flange portion 30a of the drum flange 30, the sealant 162 is installed between the flange portions 20a and 30a, and the drum flanges 20 and 30 are connected to each other via the sealant 162 while maintaining airtightness. The sealant 162 maintains the airtightness in the connection of the drum flanges 20 and 30 in the diametrical direction. When the drum flanges 20 and 30 are connected to each other, the distance between the facing surfaces of the drum flanges 20 and 30, which have a relationship in which one is fitted on the other, is set to be sufficiently smaller than the thickness of the sealant 162 and one of the drum flanges 20 and 30 is fitted on the other. Therefore, the drum flanges 20 and 30 may be connected to each other such that the sealant 162 is sufficiently elastically deformed to maintain the seal performance. In addition, as described above, for the sealant 162, for example, an O-ring formed of an elastic material such as, for example, rubber may be used. When the O-ring is used for the sealant 162, a crush rate of the O-ring may be in a range of 7% to 20%. In particular, the crush rate of the O-ring may be in a range of 11% to 15%. In general, the crush rate of the O-ring is frequently set to be around 5%. However, in the connection structure 220 according to the present exemplary embodiment, the spacing between the facing surfaces 12 and 183 of the housing 10 and the magnetic annealing furnace 200, which are the connection objects, should be very narrow, and lengths of the flange portions 20a and 30a of the drum flanges 20 and 30 should also be short. Thus, it is presumed that there may be a case where there is no space for fixing by the bolt fastening or the like. Accordingly, in that case, by setting the crush rate of the sealant 162 to be higher than the common crush rate, a sufficient connection force and seal performance may be assured. In addition, the connection structure 220 may include, in the outside thereof, fixing means other than the sealant 162, which will be described later.

At one side or both sides of the location between the drum flanges 20 and 30 where the sealant 162 is installed, a groove 30c may be formed to accommodate the inner peripheral portion of the sealant 162 for positioning and installation of the sealant 162. In that case, the groove 30c may be formed at least on the outer peripheral surface of the inner drum flange 30. The O-ring is commonly installed on the outer peripheral surface of the drum flange 30 side to be internally fitted. In that state, fitting is performed such that the drum flange 30 to be internally fitted is fitted to the drum flange 20 to be fitted externally, or the drum flange 20 positioned outside is fitted externally on the drum flange 30 positioned inside. In the connection structure 220 according to the present exemplary embodiment, the magnetic annealing furnace 200 provided with the magnet 190 is very heavy and thus in many cases, may be impossible to move after installation. Therefore, the sealant 162 is installed within the groove 30c formed on the flange portion 30a of the drum flange 30, and in the state, the flange portion 20a of the drum flange 20 is fitted externally on the flange portion 30a of the drum flange 30 to cover the flange portion 30a of the drum flange portion 30 from the upper side. Accordingly, as illustrated in FIG. 4B, an airtight connection may be performed in which the sealant 162 is installed between the drum flanges 20 and 30.

In addition, when a sealant 161, which may allow a deviation in the diametrical direction, is installed, it may contribute to securing a tolerance t2 in the diametrical direction. Even if a slight deviation occurred at a position where the housing 10 and the magnetic annealing furnace 200 are connected to each other, the connection maintaining airtightness is enabled since the sealant 161 may allow the deviation in the diametrical direction. In addition, in order to secure the tolerance t2, a structure, which allows the deviation in the diametrical direction, other than the sealant 161, may be adopted (e.g., increasing the size of a screw hole for the bolt 40 (not illustrated)) so that the tolerance t2 may be secured by the cooperation thereof. The tolerance t2 in the diametrical direction may be variously and properly set depending on, for example, a use, a structure, or a material. For example, when the tolerance t1 in the axial direction illustrated in FIG. 4A is ±10 mm, setting to secure t2=±5 mm may be acceptable.

As illustrated in FIGS. 4A and 4B, the connection structure 220 according to the present exemplary embodiment is provided with the sealants 161 and 162 in both the axial and diametrical directions, so that the sealant 161 may allow the deviation in the diametrical direction, and the sealant 162 may allow the deviation in the axial direction, thereby allowing the tolerances to occur in both the axial and diametrical directions. Accordingly, as illustrated in FIG. 3, an angle tolerance t3 may be generated between the housing 10 and the magnetic annealing furnace 200 (the annealing furnace 180). The angle tolerance t3 may be set to a proper value depending on, for example, a use, a structure, or a material. In a case where the axial direction tolerance t1=±10 and the diametrical direction tolerance t2=±5, setting to secure t3=±0.5° may be acceptable. In addition, FIG. 3 also represents a tolerance t0 of the installation reference surface of the magnet shield 210 that accommodates the magnet annealing furnace 200. The tolerance t0 of the installation reference surface of the magnet shield 210 may also be variously set depending on, for example, a use. For example, setting to secure t0=±2 mm may be acceptable.

As described above, according to the connection structure 220 of the present exemplary embodiment, the drum flanges 20 and 30 are employed and fixing and connection are performed via the sealants 161 and 162 in both the axial and diametrical directions. Thus, tolerances may be secured in both the axial and diametrical directions. Further, even if a slight deviation has occurred between the housing 10 and the magnetic annealing furnace 200, the housing 10 and the annealing furnace 200 can be hermetically connected to each other while absorbing the deviation.

In addition, it has been described that the sealant 161 generates a tolerance in the diametrical direction with reference to FIGS. 4A and 4B and the sealant 162 generates a tolerance in the axial direction. However, the sealant 161 also slightly contributes to the generation of the tolerance in the axial direction, and the sealant 162 also slightly contributes to the generation of the tolerance in the diametrical direction. Both the sealants 161 and 162 cooperate with each other. That is, the directions of the sealants 161 and 162 are not clearly separated from each other. The illustrations FIGS. 4A and 4B are intended to describe that the sealant 161 mainly contributes to the generation of the tolerance in the diametrical direction, and the sealant 162 mainly contributes to the generation of the tolerance in the axial direction, and are not intended to exclude the contribution of the sealant 161 to the securing of the tolerance t2 in the axial direction, and the contribution of the sealant 162 to the securing of the tolerance t1 in the diametrical direction.

Figure 5:
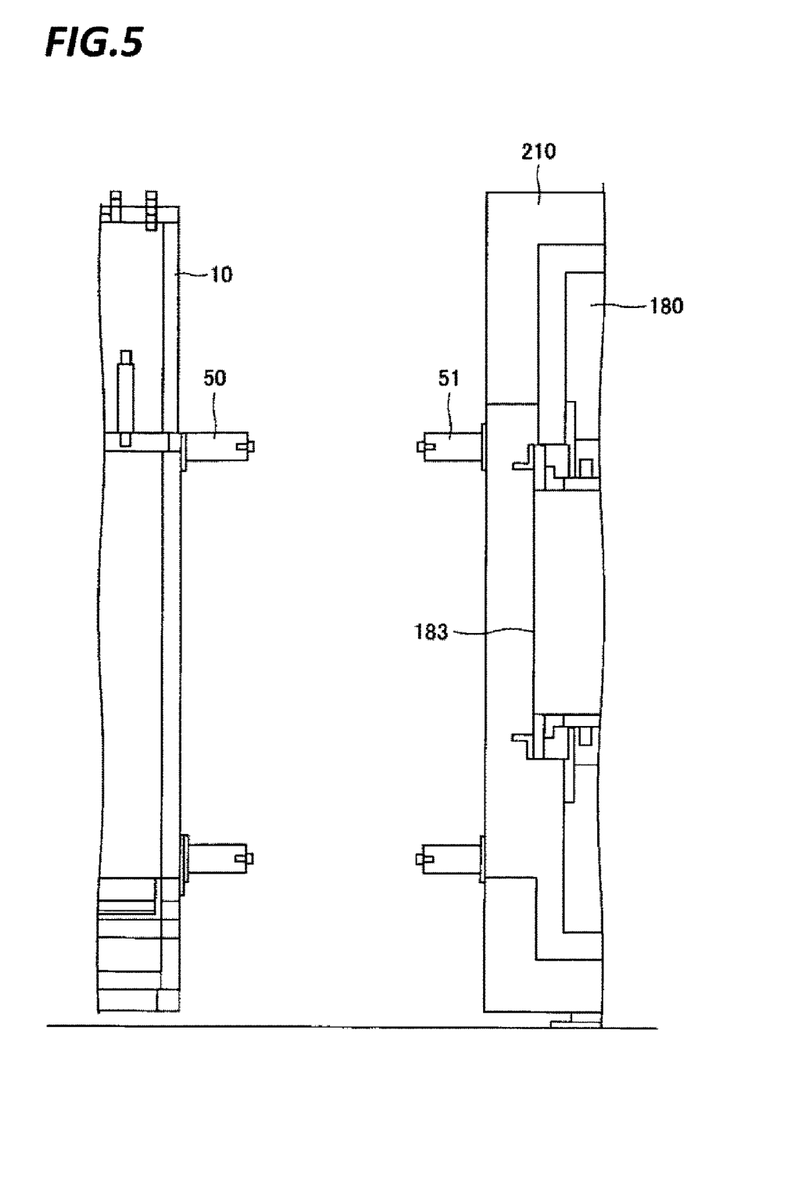
FIG. 5 is a view for describing an additional structure of the connection structure according to the first exemplary embodiment of the present disclosure.

FIG. 5 is a view for describing an additional structure of the connection structure according to the first exemplary embodiment of the present disclosure. In FIG. 5, guide pins 50 and 51 are installed on the facing surfaces of the housing 10 and the magnetic annealing furnace 200. Insertion holes (not illustrated) are formed on the facing surfaces of the guide pins 50 and 51, and the guide pins 50 and 51 are inserted into the insertion holes so as to enable rough position alignment. Accordingly, the guide pins 50 and 51 and the corresponding insertion holes may be provided and used for positioning when connecting the housing 10 and the magnetic annealing furnace 200 to each other, as needed. With this configuration, the positioning may be easily carried out when connecting the housing 10 and the magnetic annealing furnace 200 to each other.

Figure 6A:
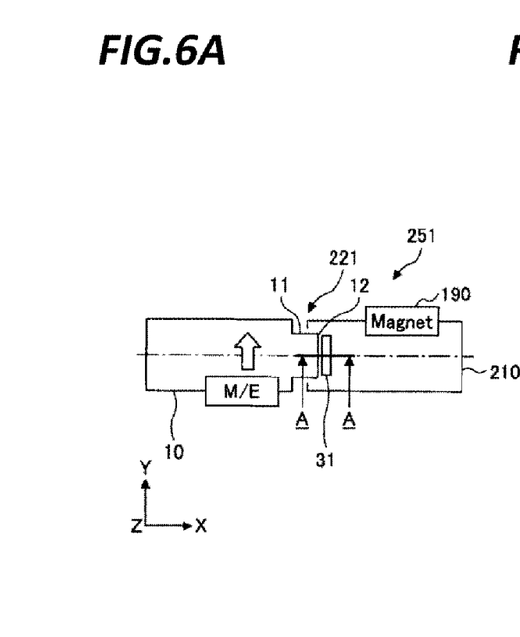
FIG. 6A is a view illustrating an overall configuration of the exemplary magnetic annealing apparatus including the connection structure according to the second exemplary embodiment of the present disclosure.
Figure 6B:
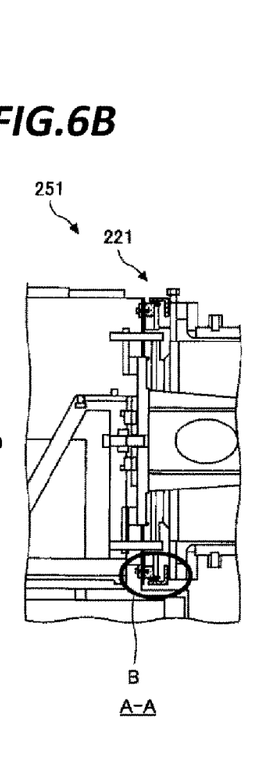
FIG. 6B is a cross-sectional view taken along line A-A in FIG. 6A in which a configuration of the exemplary magnetic annealing apparatus is illustrated.
Figure 6C:
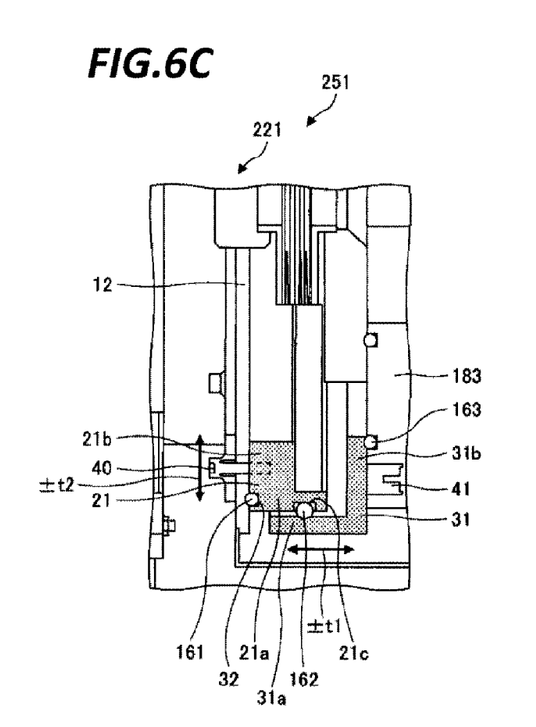
FIG. 6C is an enlarged view illustrating an area B of FIG. 6B in an enlarged scale.

FIGS. 6A to 6C are views for describing an exemplary connection structure 221 and an exemplary magnetic annealing apparatus 251 according to a second exemplary embodiment of the present disclosure. FIG. 6A is a view illustrating an overall configuration of the exemplary magnetic annealing apparatus 251 including the connection structure 221 according to the second exemplary embodiment of the present disclosure. As illustrated in FIG. 6A, the overall configuration is not significantly different from the magnetic annealing device 250 according to the first exemplary embodiment. Since the configuration in the cross section taken along line A-A in FIG. 6B are different from that the magnet annealing apparatus 250 and the connection structure 220 according to the first exemplary embodiment, FIG. 6A represents a location thereof.

FIG. 6B is a view illustrating an exemplary configuration in the cross section taken along line A-A in FIG. 6A. In FIG. 6B, the location of the area B has a configuration different from that in the connection structure 220 and the magnetic annealing apparatus 250 according to the first exemplary embodiment.

FIG. 6C is an enlarged view illustrating the area B in FIG. 6B in an enlarged scale. In FIG. 6C, the connection structure 221 and the magnetic annealing structure 251 according to the second exemplary embodiment of the present disclosure are the same as the connection structure 220 and the magnetic annealing apparatus 250 according to the first exemplary embodiment in that a drum flange 21 is fixed to the planar surface 12 of the front end of the connection portion 11 of the housing 10 via the sealant 161 by the bolt 40, and a drum flange 31 is fixed to the gas flange surface 183 of the magnetic annealing furnace 200 via the sealant 163 by the bolt 41. However, the connection structure 221 and the magnetic annealing apparatus 251 according to the second exemplary embodiment of the present disclosure are different from the connection structure 220 and the magnetic annealing apparatus 250 according to the first exemplary embodiment in that the drum flange 21 is internally fitted to the drum flange 31 rather than being externally fitted on the drum flange 31. In this way, the drum flange 21 may have a structure that is inserted into the drum flange 31 so as to connect the housing 10 and the magnetic annealing furnace 200 to each other.

More specifically, in the connection structure 221 according to the second exemplary embodiment, the sealant 162 is installed on the outer peripheral surface of the flange portion 21a of the drum flange 21. The flange portion 21a is inserted into the flange portion 31a of the drum flange 31, the sealant 162 is installed between the inner peripheral surface of the flange portion 31a and the outer peripheral surface of the flange portion 21a, and the drum flange 21 and the drum flange 31 are connected to each other via the sealant 162. In addition, a groove 21c, in which the sealant 162 may be installed, may be formed on the outer peripheral surface of the flange portion 21a of the drum flange 21, as needed. In this case, the sealant 162 is installed on the outer peripheral surface of the flange portion 21a of the drum flange 21, e.g., within the groove 21c, and in this state, the drum flange 21 is fitted into the drum flange 31. As a result, the connection structure 221 is configured as illustrated in FIG. 6C.

In addition, the connection structure 221 according to the second exemplary embodiment is the same as the connection structure according to the first exemplary embodiment in that the attachment portion 21b of the drum flange 21 is fastened and fixed to the front end surface 12 of the housing 10 via the sealant 161 by the bolt 40, and the attachment portion 31b of the drum flange 31 is fastened and fixed to the gas flange surface 183 by the bolt 41. In addition, the connection structure according to the second exemplary embodiment is also the same as the connection structure 220 according to the first exemplary embodiment in that the sealants 161 and 162 may be O-rings.

According to the connection structure 221 and the magnet annealing apparatus 251 of the second exemplary embodiment, with the structure in which the drum flange 21 of the housing 10 side is inserted into the drum flange 31 of the magnetic annealing furnace 200 side, the sealant 161 in the axial direction and the sealant 162 in the diametrical direction secure the tolerances in both the axial and diametrical directions, and a positional deviation can be absorbed at the time of connecting the housing 10 and the magnetic annealing furnace 200 to each other while maintaining the seal performance. That is, the connection structure 221 and the magnetic anneal device 251 according to the second exemplary embodiment can also achieve the same effect as that in the connection structure 220 and the magnetic annealing apparatus 250 according to the first exemplary embodiment, and implement the same tolerances t1 to t3 as those in the connection structure 220 and the magnetic annealing apparatus 250 according to the first exemplary embodiment.

Figure 7A:
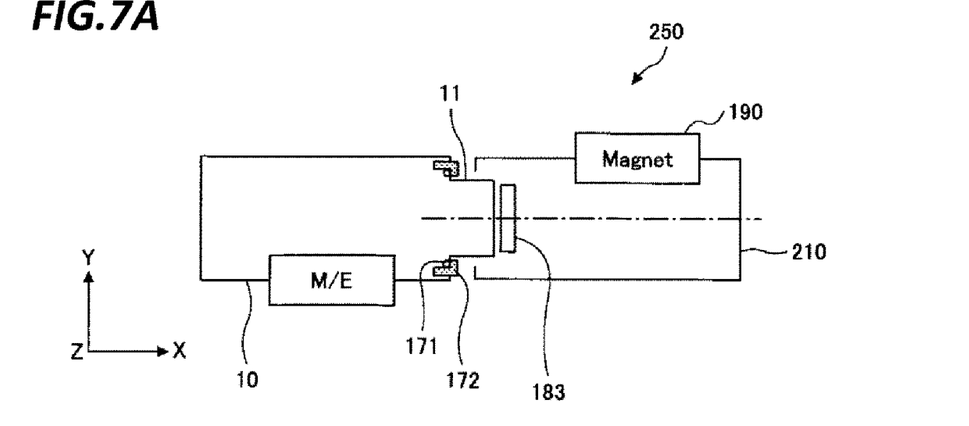
FIG. 7A is a top view illustrating an exemplary connection structure and an exemplary magnetic annealing apparatus, which have the additional positioning and fixing structure, according to the exemplary embodiment of the present disclosure.
Figure 7B:
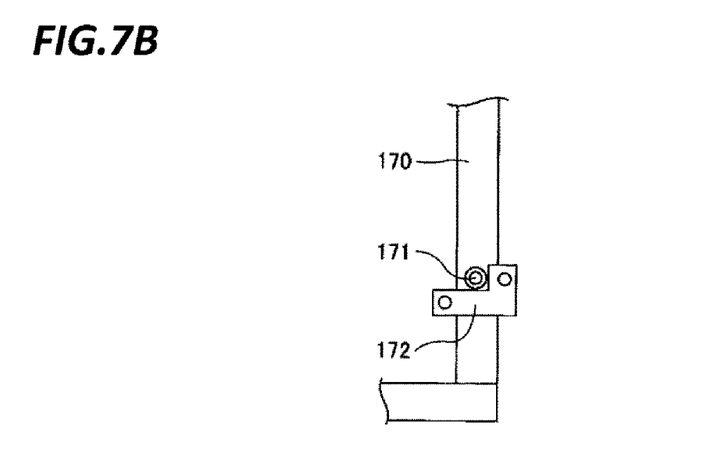

FIGS. 7A and 7B are views illustrating an exemplary additional housing positioning fixing structure of the connection structure and the magnetic annealing apparatus according to an exemplary embodiment of the present disclosure. In the first and second exemplary embodiments, descriptions have been made on the connection structures 220 and 221 using the drum flanges 20, 21, 30 and 31. However, the housing 10 may be positioned on and fixed to a floor after the connection of the drum flanges 20, 21, 30, and 31, as needed. As a result, the housing 10 and the magnetic annealing furnace 200 may be connected to each other more reliably, and the housing 10 and the magnetic annealing furnace 200 may be easily connected to each other even after repair.

FIG. 7A is a top view illustrating an connection structure and an exemplary magnetic annealing apparatus having an additional positioning fixing structure according to an exemplary embodiment of the present disclosure. In FIG. 7A, a positioning guide 171 and a positioning plate 172 are provided in base side area rather than on the connection portion 11 of the housing 10.

FIG. 7B is a view illustrating an exemplary additional housing positioning fixing structure. FIG. 7B illustrates a frame 170, a positioning guide 171, and a positioning plate 172. The frame 170 is a frame structure that fixes the housing 10 and is installed on a floor below the housing 10 to support the housing 10. The positioning guide 171 is a member that is fixed to the frame 170 to position the housing 10. The positioning plate 172 is a plate that is fixed to the floor to position the housing 10. The positioning plate 172 is engaged with the positioning guide 171. That is, positioning among the floor, the positioning plate 172, the positioning guide 171, and the frame 170 may be carried out by engaging the positioning plate 172 fixed to the floor and the positioning guide 171 fixed to the frame 170 with each other. In addition, since the frame 170 supports the housing 10, the positioning of the housing 10 is enabled. Once an exact position of the housing 10 is determined when installing the housing 10, the housing 10 may be installed at the determined position upon installation after a subsequent repair. Thus, reinstallation of the housing 10 may be easily carried out after repair.

Figure 8A:
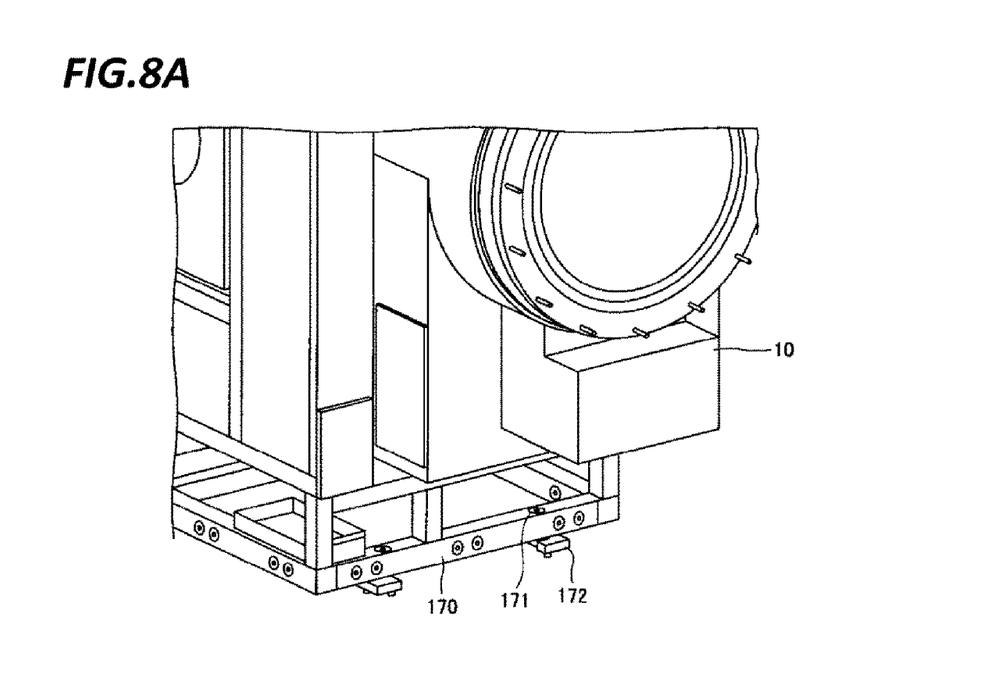
FIG. 8A is a perspective view illustrating the exemplary additional housing positioning structure.
Figure 8B:
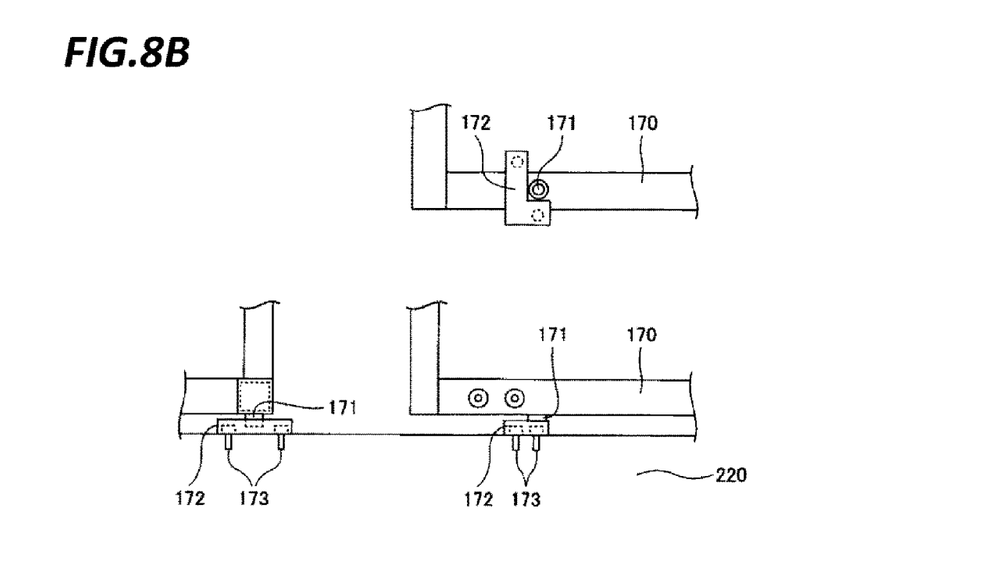
FIG. 8B illustrates front and plan views of the additional housing positioning structure.

FIGS. 8A and 8B are views illustrating a detailed configuration of an exemplary additional housing positioning structure. FIG. 8A is a perspective view illustrating the exemplary additional housing positioning structure. As illustrated in FIG. 8A, the frame 170 is installed below the housing 10 to support the housing 10. The positioning plate 172 fixed to the floor and the positioning guide 171 are engaged with each other such that the positioning of the housing 10 is enabled.

FIG. 8B illustrates a front view and a plan view of the additional housing positioning structure. FIG. 8B illustrates the state in which the positioning plate 172 is fixed to a floor 220 by a screw 173, the frame 170 is positioned on the positioning plate 172, the positioning guide 171 fixed to the frame and the positioning plate 172 are engaged with each other, and the housing 10 is positioned and fixed to the floor 220 via the frame 170. In this way, the housing 10 may be fixed as illustrated in FIG. 8B after the connection using the drum flanges 20, 21, 30 and 31, as needed.

Figure 9:
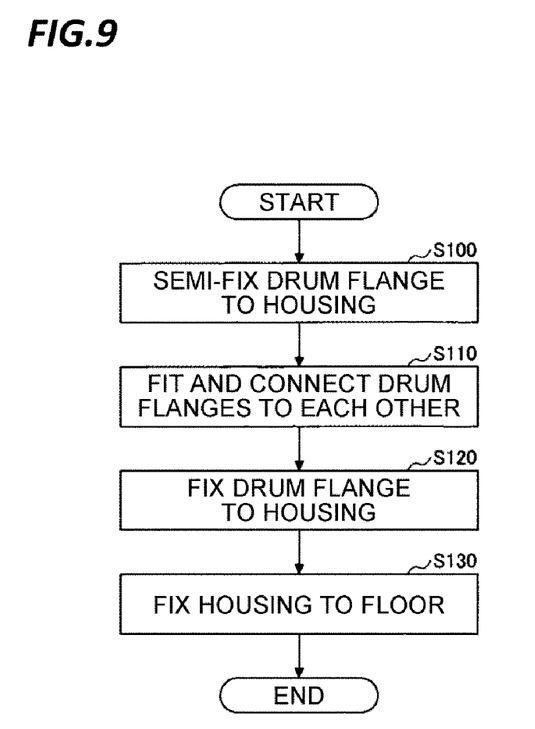
FIG. 9 is a flow chart illustrating a processing flow of a connecting method according to an exemplary embodiment of the present disclosure.

Next, descriptions will be made on a connecting method of a housing and a magnetic annealing furnace, according to an exemplary embodiment of the present disclosure, with reference to FIG. 9. FIG. 9 is a flow chart illustrating a processing flow of the connecting method according to an exemplary embodiment of the present disclosure. In addition, components, which are the same as the components described above, will be denoted by the same reference numerals, and descriptions thereof will be omitted. While FIG. 9 illustrates the connection structure 220 and the magnetic annealing apparatus 250 according to the first exemplary embodiment as an example, the connecting method according to an exemplary embodiment of the present disclosure may be identically applied to the connection structure 221 and the magnetic annealing apparatus 251 according to the second exemplary embodiment.

In FIG. 9, at step S100, the drum flange 20 is semi-fixed to the housing 10. Specifically, the attachment portion 20*b* of the drum flange 20 is semi-fixed to the front end surface 12 of the housing 10 by a fixing member such as the bolt 40, and in this case, the fixing member is in the semi-fixed state. For example, when the bolt 40 is used as the fixing member, the bolt 40 may be screwed halfway in a state where some threads thereof are left rather than being rotated to the final of the threads and is so as to semi-fix the drum flange 20 to the housing 10.

At step S110, the drum flange 20 is fitted on the drum flange 30, and the drum flanges 20 and 30 are connected and fixed to each other in the state where the sealant 162 is interposed therebetween in the diametrical direction. Accordingly, the housing 10 is fixed to the magnetic annealing furnace 200.

At step S120, the drum flange 20 is fixed to the housing 10. Specifically, the fixing member such as, for example, the bolt 40 is fastened to the final portion so as to bring the drum flange 20 to the fixed state from the semi-fixed state. Accordingly, the connection of the housing 10 and the magnetic annealing furnace 200 to each other is temporarily finished.

At step S130, the housing 10 is further fixed to the floor 220 as needed. As illustrated in FIGS. 7A and 7B and FIGS. 8A and 8B, the housing 10 is fixed to the floor 220 by using, for example, the frame 170, the positioning guide 171, and the positioning plate 172. Step S130 is an arbitrary step and may be provided, as needed.

In this sequence, the connection of the housing 10 to the magnetic annealing furnace 200 is carried out. In addition, when the magnetic annealing treatment is repeated, and the housing 10 is removed from the magnetic annealing furnace 200 to be repaired, the drum flanges 20 and 30 may be released from each other, and the drum flange 20 may be removed from the housing 10, as needed.

When connecting the housing 10 to the magnetic annealing furnace 200 after the repair, the same processing flow as that in FIG. 9 may be carried out in the case where the drum flange 20 has been removed from the housing 10, or the processing flow of FIG. 9 may be carried out from step S110 in the case where the drum flange 20 has not been removed from the housing 10. When the positioning and fixing of the housing 10 in relation to the floor 220 have been carried out prior to the repair, the reinstallation and the reconnection of the housing 10 may be easily carried out by using the frame 170 and so on.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A connection structure comprising:
   a first drum flange that is attached and fixed to a magnetic annealing furnace that is provided with a fixedly arranged magnet and includes a first flange portion having a cylindrical shape;

a second drum flange that is attached and fixed to a housing and includes a second flange portion having a cylindrical shape configured to externally or internally fit the first flange portion of the first drum flange thereto in order to connect the housing to the magnetic annealing furnace;

a first sealant that is installed between surfaces of the housing and the second drum flange which are opposite to each other in an axial direction of the first drum flange and the second drum flange, in order to hermetically connect the housing and the magnetic annealing furnace permanently in the axial direction; and a second sealant that is installed between surfaces of the first flange portion and the second flange portion which are opposite to each other in a diametrical direction of the first drum flange and the second drum flange, when the first drum flange and the second drum flange are hermetically connected in the diametrical direction for the magnetic annealing furnace to be closed by the housing.

2. The connection structure of claim 1, wherein a first groove is formed on one of the surfaces of the housing and the second drum flange and a second groove is formed on one of the surfaces of the first and second flange portions, the first and second sealants being installed in the first and second grooves, respectively.

3. The connection structure of claim 2, wherein the first and second sealants are O-rings.

4. The connection structure of claim 3, wherein the O-ring used as the second sealant has a crush rate that is set to be 7% to 20%.

5. The connection structure of claim 1, wherein each of the first and second drum flanges includes an attachment portion having a surface that forms a right angle with the surface of the first flange portion and the second flange portion, respectively, from one end of the first flange portion and the second flange portion, respectively, the attachment portion being configured to be attached to a planar surface.

6. The connection structure of claim 5, wherein the magnetic annealing furnace includes a substrate carry-in port, and the attachment portion of the first drum flange is fixed to a planar surface around the substrate carry-in port of the magnetic annealing furnace by a fixing member.

7. The connection structure of claim 5, wherein the attachment portion of the second drum flange is fixed to a planar surface of an outer wall of the housing via the first sealant by a fixing member.

8. The connection structure of claim 6, wherein the fixing member is a bolt.

9. The connection structure of claim 1, wherein the second flange portion of the second drum flange is inserted into and fixed to the inside of the first flange portion of the first drum flange via the second sealant.

10. The connection structure of claim 1, wherein at least one of surfaces of the magnetic annealing furnace and the housing which are opposite to each other in the axial direction of the first drum flange and the second drum flange is provided with a guide pin for positioning.

11. A magnetic annealing apparatus comprising:
a housing;
a magnetic annealing furnace that is provided with a fixedly arranged magnet; and
a connection structure that connects the housing to the magnetic annealing furnace, the connection structure including:

a first drum flange that is attached and fixed to the magnetic annealing furnace and includes a first flange portion having a cylindrical shape;

a second drum flange that is attached and fixed to the housing and includes a second flange portion having a cylindrical shape configured to externally or internally fit the first flange portion of the first drum flange thereto in order to connect the housing to the magnetic annealing furnace;

a first sealant that is installed between surfaces of the housing and the second drum flange which are opposite to each other in an axial direction of the first drum flange and the second drum flange, in order to hermetically connect the housing and the magnetic annealing furnace permanently in the axial direction; and a second sealant that is installed between surfaces of the first flange portion and the second flange portion which are opposite to each other in a diametrical direction of the first drum flange and the second drum flange, when the first drum flange and the second drum flange are hermetically connected in the diametrical direction for the magnetic annealing furnace to be closed by the housing.

12. The magnetic annealing apparatus of claim 11, wherein the housing is a load chamber configured to carry a substrate into the magnetic annealing furnace.

13. The magnetic annealing apparatus of claim 11, further comprising:
a fixing member configured to fix the housing to a floor after the magnetic annealing furnace and the housing are connected to each other through the connection structure.

14. A method of connecting, the method comprising:
providing a first drum flange that is attached and fixed to a magnetic annealing furnace that is provided with a fixedly arranged magnet and includes a first flange portion having a cylindrical shape;

semi-fixing a second drum flange, which includes a second flange portion having a cylindrical shape configured to externally or internally fit the first flange portion of the first drum flange thereto in order to connect a housing to the magnetic annealing furnace, and an attachment portion having a planar surface expanding vertically to a surface of the second flange portion from one end of the second flange portion, to an outer wall of the housing via a first sealant by using a fixing member in order to hermetically connect the housing and the magnetic annealing furnace permanently in an axial direction of the first drum flange and the second drum flange;

installing a second sealant on the second flange portion of the second drum flange;

fitting the second drum flange to the first drum flange via the second sealant in order to hermetically connect the second drum flange to the first drum flange in a diametrical direction of the first drum flange and the second drum flange; and fixing the second drum flange to the outer wall of the housing by using the fixing member for the magnetic annealing furnace to be closed by the housing.

15. The method of claim 14, further comprising:
fixing the housing onto a floor, after the fixing of the second drum flange to the outer wall of the housing.

16. The method of claim 14, wherein a guide pin for positioning is installed on at least one of facing surfaces of the magnetic annealing furnace and the housing, and the fitting of the second drum flange to the first drum flange via the second sealant to connect the second drum flange to the first drum flange is performed while the positioning of the second drum flange is performed by using the corresponding guide pin.

17. The method of claim 14, wherein the fixing member is a bolt, the semi-fixing of the second drum flange to the outer wall of the housing via the first sealant by the fixing member is performed by fastening the bolt halfway, and the fixing of the second drum flange onto the outer wall of the housing is performed by tightening the bolt to the end of the bolt thread.

18. The magnetic annealing apparatus of claim 13, wherein the fixing member includes:

a frame that fixes the housing and is installed on the floor below the housing to support the housing;

a positioning guide fixed to the frame to position the housing; and a positioning plate fixed to the floor to position the housing and engaged with the positioning guide.

19. The connection structure of claim 1, wherein a magnetic annealing furnace side of the housing has a connection portion configured in a cylindrical shape, of which a width is narrowed to be connected with the magnetic annealing furnace, and the second drum flange is fixed to a leading end surface of the connection portion of the housing via the first sealant.

* * * * *